(12) United States Patent
Chen

(10) Patent No.: US 10,148,221 B2
(45) Date of Patent: Dec. 4, 2018

(54) SOLAR ENERGY LIGHT COLLECTING DEVICE AND SYSTEM THEREOF

(71) Applicant: Collection Light Environment Energy Develop Limited Company, New Taipei (TW)

(72) Inventor: Yeu-Wen Chen, New Taipei (TW)

(73) Assignee: COLLECTION LIGHT ENVIRONMENT ENERGY DEVELOP LIMITED COMPANY, New Taipei (TW)

( * ) Notice: Subject to any disclaimer, the term of this patent is extended or adjusted under 35 U.S.C. 154(b) by 82 days.

(21) Appl. No.: 15/357,246

(22) Filed: Nov. 21, 2016

(65) Prior Publication Data

US 2017/0288605 A1 Oct. 5, 2017

(30) Foreign Application Priority Data

Apr. 1, 2016 (TW) .............................. 105204559 U
Jul. 6, 2016 (TW) .............................. 105210147 U

(51) Int. Cl.
| | |
|---|---|
| *H02S 40/22* | (2014.01) |
| *H02S 40/40* | (2014.01) |
| *H02S 20/32* | (2014.01) |
| *H02S 30/10* | (2014.01) |
| *F24J 2/14* | (2006.01) |
| *F24J 2/52* | (2006.01) |

(Continued)

(52) U.S. Cl.
CPC ................. *H02S 20/32* (2014.12); *F24J 2/14* (2013.01); *F24J 2/5233* (2013.01); *F24J 2/542* (2013.01); *H01L 31/0547* (2014.12); *H02S 20/30* (2014.12); *H02S 30/10* (2014.12); *H02S 40/22* (2014.12); *H02S 40/40* (2014.12); *F24J 2002/5458* (2013.01); *H02S 40/425* (2014.12); *H02S 40/44* (2014.12); *Y02E 10/45* (2013.01); *Y02E 10/47* (2013.01); *Y02E 10/52* (2013.01); *Y02E 10/60* (2013.01)

(58) Field of Classification Search
CPC .......... H02S 20/32; H02S 20/30; H02S 30/10; H02S 40/22; H02S 40/44; H01L 31/0547; F24J 2/14; F24J 2/5233; F24J 2/542
USPC ......................................................... 136/246
See application file for complete search history.

(56) References Cited

U.S. PATENT DOCUMENTS

| | | | |
|---|---|---|---|
| 2009/0126774 A1* | 5/2009 | Taylor, II .............. | G01S 3/7861 136/244 |
| 2011/0048496 A1* | 3/2011 | Foong ........................ | F24J 2/14 136/246 |

(Continued)

*Primary Examiner* — Jayne L Mershon
(74) *Attorney, Agent, or Firm* — Muncy, Geissler, Olds & Lowe, PC

(57) ABSTRACT

Provided herein is a solar energy light collecting device, which includes a light reflection module, a sun tracking module, and a control module. The light reflection module includes reflection units, reflection unit support beams and a support wheel frame assembly. The sun tracking module includes an angle adjustment set, a height adjustment set, and a supporter set. The control module includes a sense control unit and a driving motor. The sense control unit senses the direction of the sunlight and controls the driving motor to drive the sun tracking module, such that the light reflection module faces the direction of the sunlight. Moreover, an additional balance adjustment module can also be adopted to resolve the spatial disposition problem.

9 Claims, 8 Drawing Sheets

(51) Int. Cl.
*F24J 2/54* (2006.01)
*H02S 20/30* (2014.01)
*H01L 31/054* (2014.01)
*H02S 40/42* (2014.01)
*H02S 40/44* (2014.01)

(56) References Cited

U.S. PATENT DOCUMENTS

2013/0118099 A1\* 5/2013 Scanlon ................ F24J 2/5233
  52/173.3
2015/0303864 A1\* 10/2015 Gonzalez Moreno ... F24J 2/542
  136/246

\* cited by examiner

SOLAR ENERGY LIGHT COLLECTING DEVICE AND SYSTEM THEREOF

CROSS-REFERENCE TO RELATED APPLICATION

This application claims priority from Taiwan Patent Application No. 105204559, filed on Apr. 1, 2016; and Taiwan Patent Application No. 105210147, filed on Jul. 6, 2016 in the Taiwan Intellectual Property Office, the contents of which are hereby incorporated by reference in its entirety for all purposes.

BACKGROUND OF THE INVENTION

1. Field of the Invention

The present invention relates to a sunlight collecting device, and particularly relates to a solar energy light collecting device and a system thereof, which assist solar cells to collect sunlight and to dissipate heat, such that the cost of solar power device can be reduced, and the efficiency of electric power generation can be increased effectively.

2. Description of the Related Art

The global warming is nowadays no longer just an issue but actually a concern to every life form on the Earth. Extreme weather has caused countless losses of properties and lives all over the world and has become a problem that must be seriously addressed and urgently resolved. However, since energy fuels civilization, the amount of various types of energy viable to extract is bound to decrease with time.

Therefore, various kinds of renewable and pollution-free green energy, such as tidal power, wind power, water power, geothermal heat, solar energy, etc., have attracted more and more attention. Among them, the cleanest and the most unlimited solar energy is still the best choice. Therefore, the ways to improve the efficiency and to reduce the energy conversion cost of solar energy become the focuses of the research in these years.

The mainstream design of light concentrators is to use reflectors with various specific curvatures. Because of environmental differences, such as the differences of latitudes, terrains, topographies, shading conditions, etc., the integrated reflectors have to be designed case by case. This results in a high production cost and the popularization difficulty.

Because of these reasons, after years of hard work and researches, the inventors of the present invention design a solar energy light collecting device and the system thereof to solve the conventional technical issues and to improve the practical applicability in industry.

SUMMARY OF THE INVENTION

For the purpose of resolving the conventional technical problems, the present invention provides a solar energy light collecting device, in which a plurality of reflection units are disposed around the support wheel frame assembly. The number of the reflection units and the power of concentration can be manipulated depending on the diameter of the support wheel frame of the support wheel frame assembly. By these, the shortcomings of the prior art can be overcome.

Also for the purpose of resolving the aforementioned problems, the present invention also provides a solar power device with the manufacturing process simplified and the design cost reduced through the modularization design, so as to facilitate the solar energy popularization.

Based on the purposes above, the present invention provides a solar energy light collecting device, which includes a light reflection module, a sun tracking module, and a control module. The light reflection module includes a plurality of reflection units, a reflection unit support beam, and a support wheel frame assembly. The plurality of reflection units are disposed on the reflection unit support beam. Two ends of the reflection unit support beam are connected and fixed to the support wheel frame assembly. The support wheel frame assembly includes at least two support wheel frames and one rotation axis. The sun tracking module includes an angle adjustment set, a height adjustment set, and a supporter set. Two sides of the supporter set are respectively connected to the angle adjustment set and the height adjustment set. The support wheel frame assembly is disposed on the supporter set. Thereby, the rotation axis acts as the rotational center of the entire light reflection module. The control module includes a sense control unit and a driving motor. The sense control unit senses the direction of the sunlight and controls the driving motor to drive the sun tracking module, such that the light reflection module faces the direction of the sunlight.

Preferably, the support wheel frame assembly also includes a counter weight balancing rod, which is used to adjust the rotational center of gravity of the light reflection module.

Preferably, the support wheel frame assembly also includes a plurality of solar cell support tubes, and a plurality of solar cells disposed correspondingly around the solar cell support tubes.

Preferably, the light reflection module also includes a plurality of auxiliary concentration units to improve the light concentration power. The auxiliary concentration units are disposed outside the hollow rod located at the rotation axis and/or outside the plurality of solar cell support tubes.

Preferably, the auxiliary concentration unit includes a condenser lens, an auxiliary reflector, or a combination thereof.

Preferably, the supporter set also includes a South End supporter, a North End supporter, and two rotational support rods. The height adjustment set is disposed at the North End supporter, and the angle adjustment set is disposed at the South End supporter and drives one of the two rotational support rods to adjust the position of the light reflection module.

Preferably, the plurality of reflection units are rectangular reflective plates with concave surfaces or strip-shaped reflective plates with flat surfaces.

Based on the purpose above, the present invention also provides a solar energy light collecting system, which includes a plurality of the solar energy light collecting devices and a balance adjustment module. The solar energy light collecting device is already mentioned above, and the repetition is unnecessary. The balance adjustment module includes a three-dimensional frame structure assembly, a base support set, and a control adjustment set. The three-dimensional frame structure assembly is supported by the base support set, and the control adjustment set adjusts the position of the three-dimensional frame structure assembly.

Preferably, the three-dimensional frame structure assembly includes a plurality of parallelogram frame structures and a plurality of transverse beams. The plurality of transverse beams are pivotally connected to the plurality of parallelogram frame structures and are controlled by the control adjustment set to move vertically.

Preferably, the control adjustment set includes a control box, two cable sets, a cable spring balancer, and a cable capstan. Two cable sets are respectively connected to two sides of the three-dimensional frame structure assembly. One of the two cable sets is connected to the cable spring balancer, while the other is connected the cable capstan. While receiving the control signal from the control box, the cable capstan is actuated to move the three-dimensional frame structure assembly like a seesaw.

Preferably, the solar energy light collecting system of the present invention also includes a lifting platform configured to adjust the level or the height of the balance adjustment module. The base support set is disposed on the lifting platform.

For better understanding these purposes, the technical features, and the benefits of the practical uses of the application, the detailed description will be presented hereinafter through preferable embodiments accompanying with corresponding figures.

DESCRIPTION OF THE PREFERRED EMBODIMENTS

Figure 1:
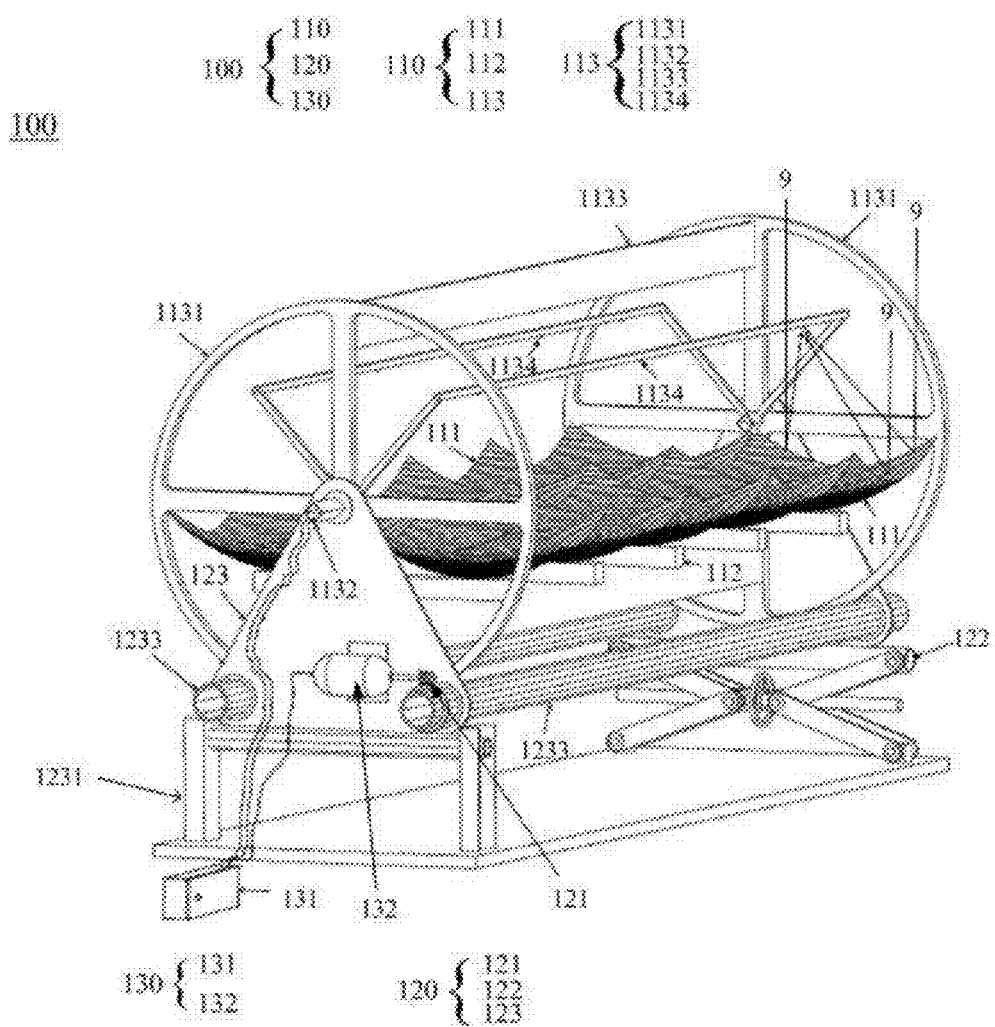
FIG. 1 shows a first schematic diagram of the solar energy light collecting device of the present invention.

The present invention will be further presented hereinafter through preferable embodiments accompanying with corresponding figures. Since being only for the illustrative and auxiliary purpose, the drawings are not necessarily implying the actual ratio or precise configuration of the products of the present invention. Therefore, the claims of the present invention should not be limited by the drawings' ratio and configuration.

To make them easier to be understood, the advantages, the features, and the technical methods to carry out the present invention will be described through certain embodiments accompanying with figures. However, the present invention should not be limited to these embodiments and can also be implemented in different ways. For one skilled in the art, the embodiments provided herein are intended to more thoroughly, comprehensively, and completely convey the scope of the present invention that is to be limited only by the claims.

The embodiments of the solar energy light collecting system of the present invention will be described referring to the corresponding figures. For better understanding, the same elements will be designated by the same reference numerals through the following embodiments.

Figure 2:
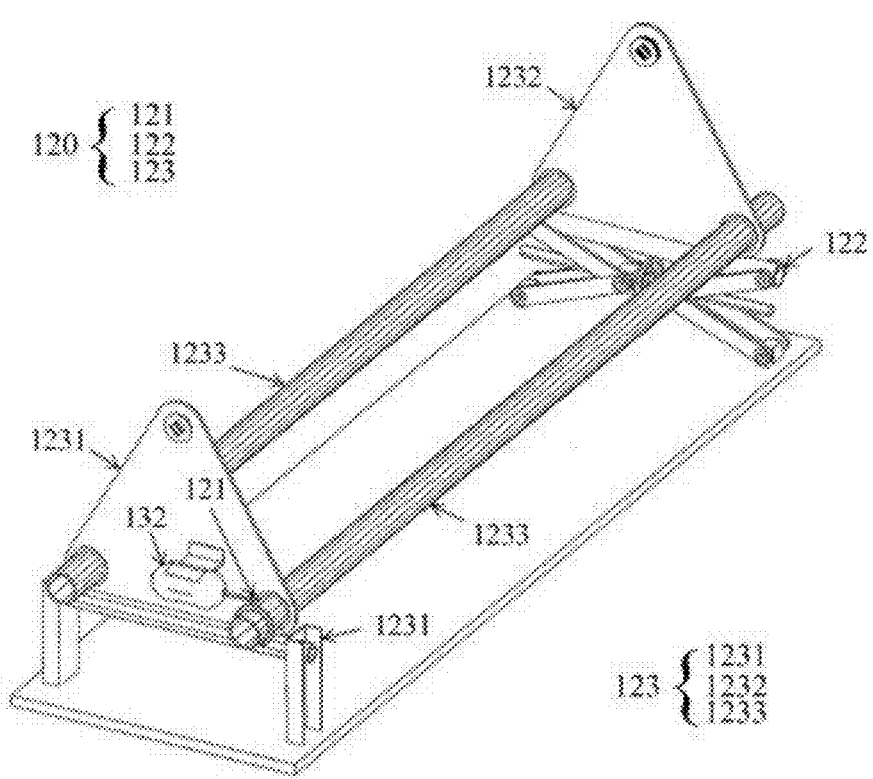
FIG. 2 shows a second schematic diagram of the solar energy light collecting device of the present invention.
Figure 3:
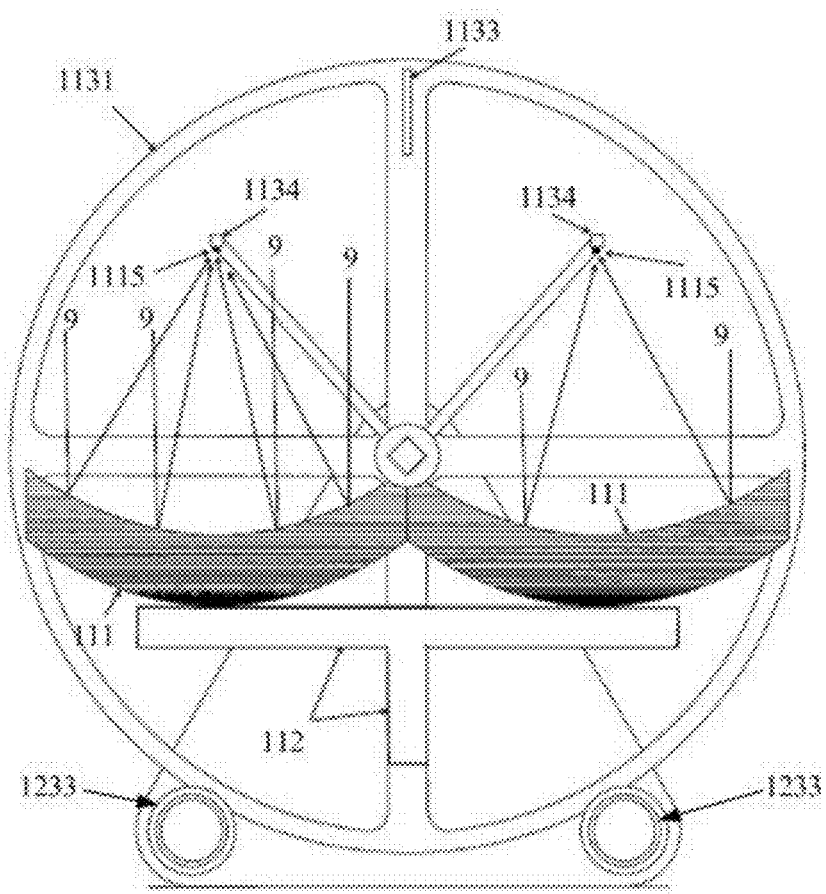
FIG. 3 shows a third schematic diagram of the solar energy light collecting device of the present invention.

Referring to FIGS. 1-3, a solar energy light collecting device 100 includes a light reflection module 110, a sun tracking module 120, and a control module 130. The light reflection module 110 includes a plurality of reflection units 111, reflection unit support beams 112, and a support wheel frame assembly 113. The plurality of reflection units 111 are disposed on the reflection unit support beams 112, two ends of each reflection unit support beam 112 are connected and fixed to the support wheel frame assembly 113, which includes at least two support wheel frames 1131 and a rotation axis. Preferably, a hollow rod 1132 can be placed at and act as the rotational axis between the at least two support wheel frames 1131.

The sun tracking module 120 includes an angle adjustment set 121, a height adjustment set 122, and a supporter set 123. The angle adjustment set 121 and the height adjustment set 122 are disposed at and connected to two sides of the supporter set 123, respectively. The support wheel frame assembly 113 is disposed on the supporter set 123. The entire light reflection module 110 rotates about the rotation axis acting as the rotational center. The control module 130 includes a sense control unit 131 and a driving motor 132. While the sense control unit 131 detects the direction of the sunlight, it controls the driving motor 132 to actuate the sun tracking module 120, such that the light reflection module 110 faces the direction of the sunlight. Preferably, the sense control unit 131 can be a detecting element, such as a photoresistor.

Moreover, the support wheel frame assembly 113 can also include a counter weight balancing rod 1133 configured to improve the structural stability and to balance the rotational center of gravity of the entire light reflection module 110. In addition, the support wheel frame assembly 113 can also include a plurality of solar cell support tubes 1134, around which a plurality of solar cells 1115 are correspondingly disposed to effectively perform the energy conversion of the concentrated sunlight.

Based on the direction of the sunlight, the present device is arranged in the south-north direction. The sun tracking module 120 is then actuated by the control module 130 according to the direction of the sunlight. When the device is applied in the Northern Hemisphere, the sun tracking module 120 needs to be adjusted to have a north end higher than a south end, and vice versa in the Southern Hemisphere, whereby the light reflection module 110 vertically facing the Sun while tracking it. Although only described with the embodiments of the Northern Hemisphere, the present invention is not limited thereto. The supporter set 123 can also include a South End supporter 1231, a North End supporter 1232, and two rotational support rods 1233. The angle adjustment set 121 is disposed at the South End supporter 1231 and configured to drive either one of the two rotational support rods 1233 to adjust the position of the light reflection module 110. The angle adjustment set 121 has a motor and a worm gear set to adjust the angle according to the daily location of the Sun, such that the light reflection module 110 can always vertically face the sun to maximize efficiency of the energy collection.

Furthermore, disposal of the height adjustment set 122 at the North End supporter 1232 can adjust the angle of the entire device to the ground according to the latitude and the season of the device setup location. Practically, the height adjustment set 122 can include a linear actuator, a single stage telescopic cylinder, or a multi-stage telescopic cylinder.

Figure 4:
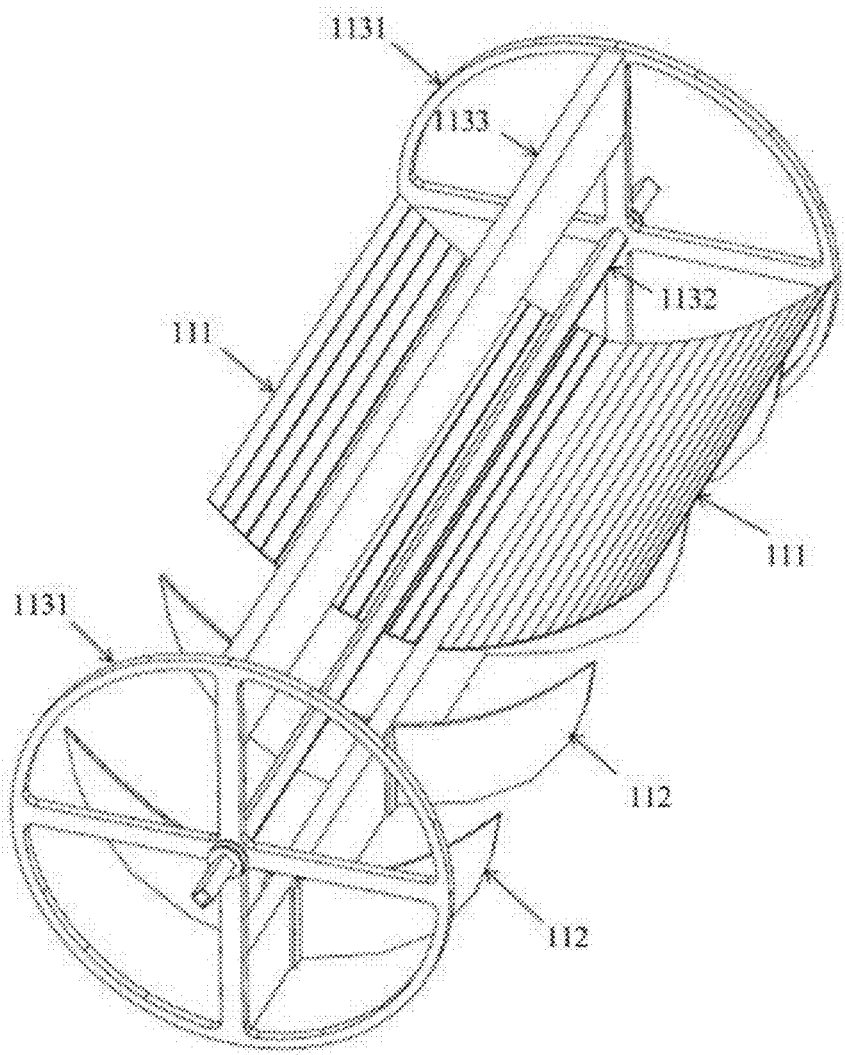
FIG. 4 shows a fourth schematic diagram of the solar energy light collecting device of the present invention.

Also referring to FIG. 4, the plurality of reflection units 111 can be rectangular reflective plates with concave surfaces (as shown in FIG. 3) or strip-shaped reflective plates with flat surfaces (as shown in FIG. 4). The number of the support wheel frame 1131 is varied according to the disposition (as for the rectangular reflective plates) or length (as for the strip-shaped reflective plates) of the plurality of reflection units 111, and the installation angle of the reflection units 111 is subtly adjusted one by one according to the diameter of the support wheel frame 1131, such that the solar rays 9 can be focused on a specific area to fulfill the purpose of light concentration.

Figure 5:
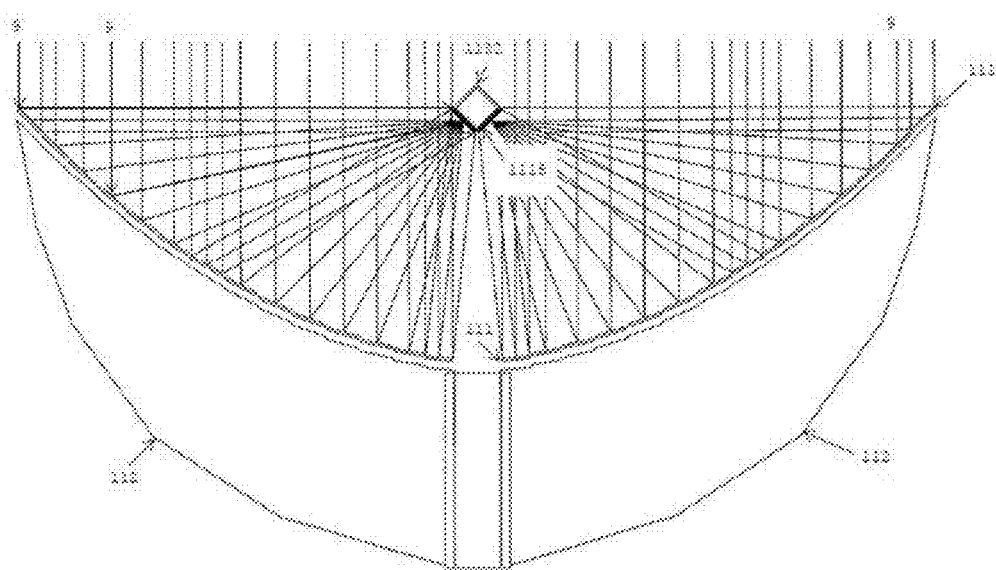
FIG. 5 shows a schematic diagram of light paths of the solar energy light collecting device of the present invention.

Also referring to FIG. 5, it shows the schematic diagram of the light paths. With different shapes of the reflection units 111, the reflection unit support beams 112 have to be adjusted and designed accordingly. For example, the curved section is divided into multiple subsections, on each of which the strip-shaped reflective plate is disposed, such that the solar rays 9 are reflected to specific areas, such as nearby the hollow rod 1132 at rotation axis and the locations of the solar cells 1115.

Actually, because of manufacturing or installation deviations of every reflection unit 111, the unabsorbed loss of light is always occurring. To solve the problem, the light reflection module 110 can also include an auxiliary concentration unit (not shown in the figures) at outer side of the hollow rod 1132 and/or the solar cell support tube 1134 to improve the light concentration power. The auxiliary concentration unit can be a condenser lens, an auxiliary reflector, or a combination thereof. While the auxiliary concentration unit is disposed under the hollow rod 1132 and/or the solar cell support tube 1134, the auxiliary concentration unit can be a condenser lens, such as a convex lens, a flat Fresnel lens, or a curved Fresnel lens. On the other hand, if a reflector is selected as the auxiliary concentration unit, it is disposed above the hollow rod 1132 and/or the solar cell support tube 1134. In this case, the reflector reflects the unabsorbed solar rays 9 back to specific area where the hollow rod 1132 and/or the solar cell support tube 1134 is located.

In addition, the hollow rod 1132 and/or the solar cell support tube 1134 can be implemented by a hollow tube for flowing working fluid therethrough. The working fluid can be a phase change material for heat storage or a cooling fluid for heat dissipation depending on the insolation conditions. The phase change material can be organic, inorganic, or eutectic material. The commonly known materials are paraffin, fatty acids, salt hydrates, etc. Because of the different applicable temperature ranges and different heat capacities, the phase change materials are chosen depending on the application ranges and characteristics of the environment. Also, while the light concentration causes high temperature of the hollow rod 1132 and the solar cell support tube 1134, the cooling water can flow inside the tube to dissipate heat. Preferably, the cooling fluid that has already absorbed the heat can also be stored for daily family uses.

The conventional light collectors are set up on the ground with flat surface. The two conventional light collectors must be spaced apart from each other by a sufficient distance to prevent the shadowing effect to each other; however, this results to high space cost that offsets the benefit. For resolving the problem, the present invention further provides an innovative solar energy light collecting system 500, which is devised from the concept of the parallelogram structure assembled with the aforementioned solar energy light collecting device 100.

Figure 6:
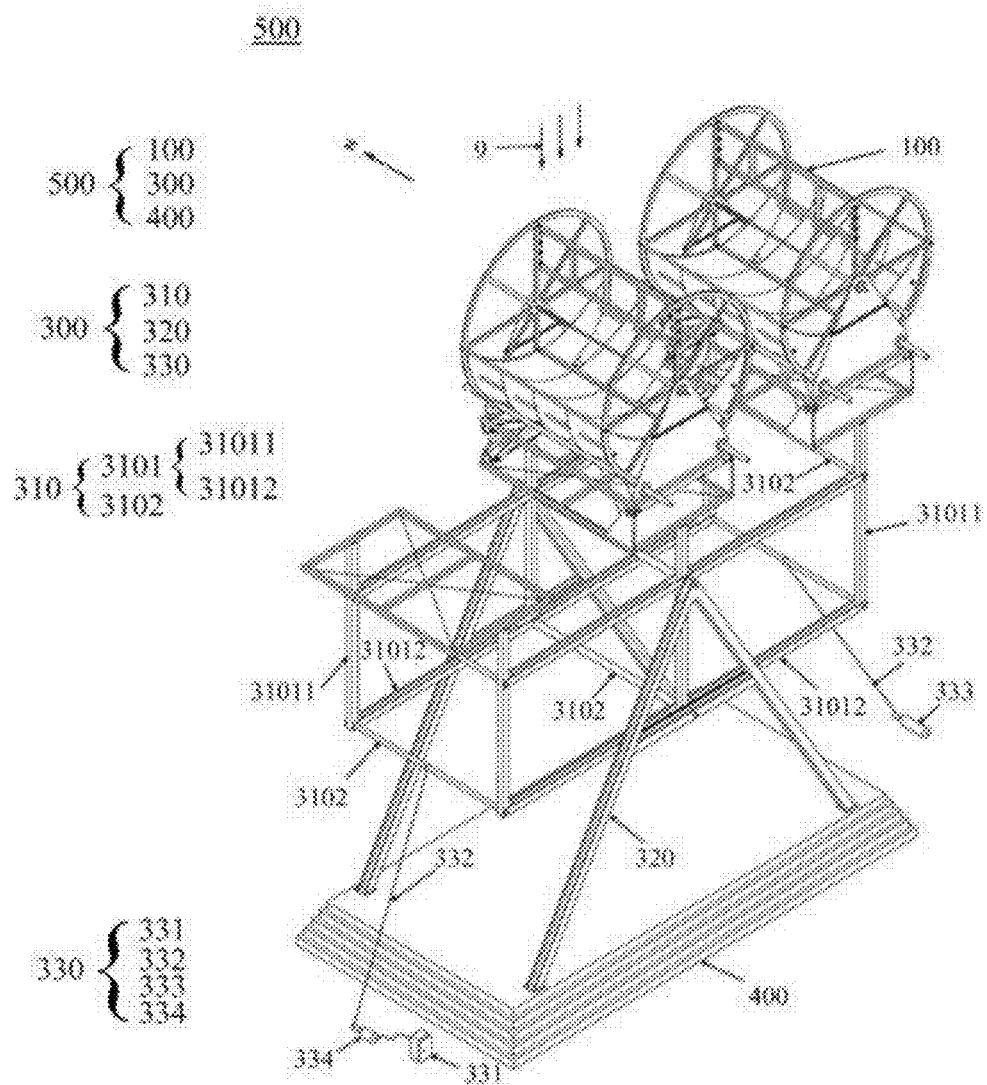
FIG. 6 shows a first schematic diagram of the solar energy light collecting system of the present invention.
Figure 7:
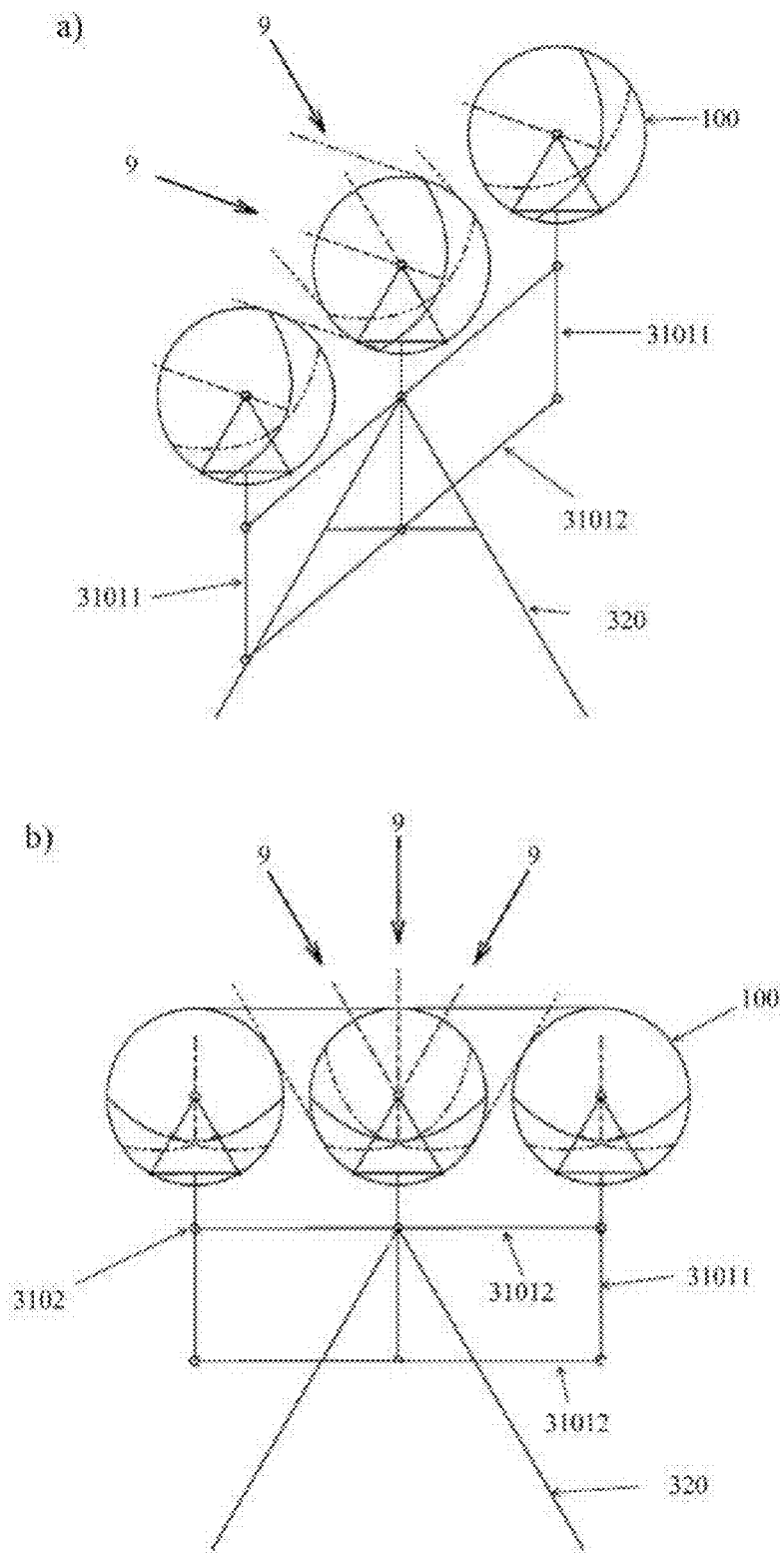
FIG. 7 shows a second schematic diagram of the solar energy light collecting system of the present invention.
Figure 8:
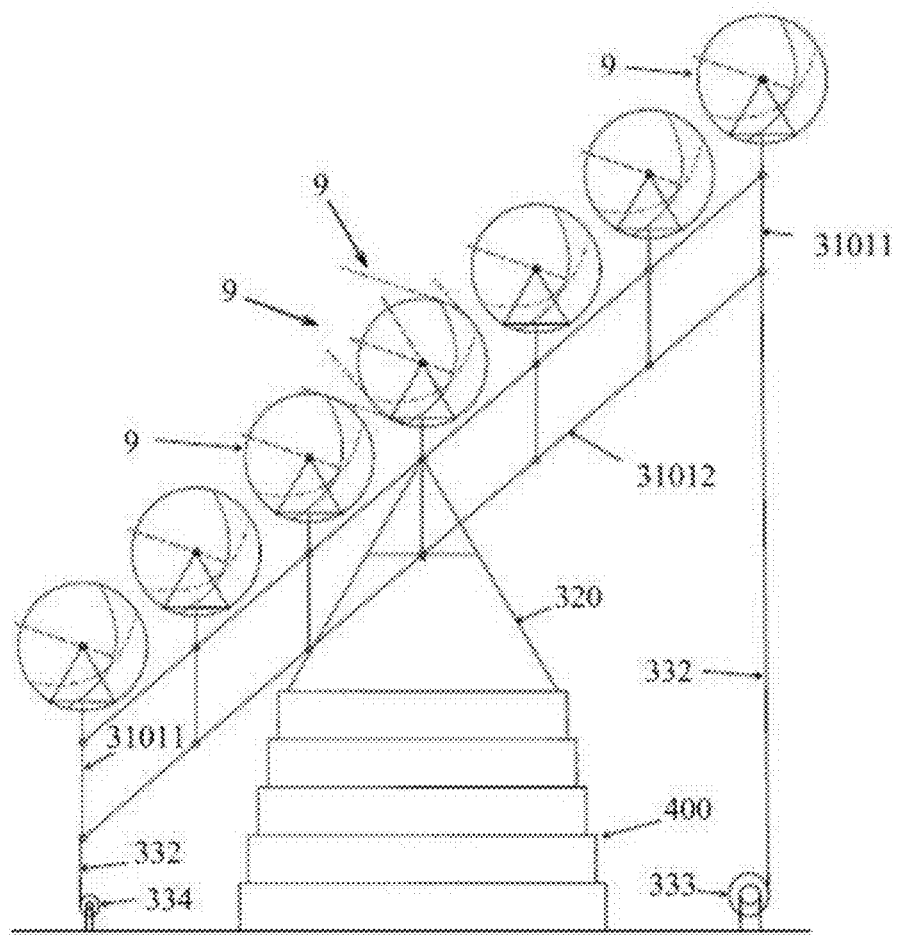
FIG. 8 shows a third schematic diagram of the solar energy light collecting system of the present invention.

Referring to FIGS. 6-8, the solar energy light collecting system 500 includes a plurality of solar energy light collecting devices 100 and a balance adjustment module 300. The solar energy light collecting device 100 is already described above, and the repetition is unnecessary. The balance adjustment module 300 includes a three-dimensional frame structure assembly 310, a base support set 320, and a control adjustment set 330. The three-dimensional frame structure assembly 310 is disposed on the base support set 320, and the control adjustment set 330 is used to adjust the position of the three-dimensional frame structure assembly 310. The three-dimensional frame structure assembly 310 includes a plurality of parallelogram frame structures 3101 and a plurality of transverse beams 3102. The plurality of transverse beams 3102 are pivotally connected to the plurality of parallelogram frame structures 3101 and are controlled to move vertically by the control adjustment set 330.

Moreover, the parallelogram frame structure 3101 includes a plurality of vertical columns 31011 and a plurality of multi-connector beams 31012. While the parallelogram frame structure 3101 is actuated, the vertical columns 31011 can maintain their vertical positions as pairs of upper and lower ones. Applying a plurality of transverse beams 3102 on at least two sets of parallelogram frame structures 3101, the three-dimensional frame structure assembly 310 that has an accommodation space can therefore be formed.

Practically, the control adjustment set 330 includes a control box 331, two cable sets 332, a cable spring balancer 333, and a cable capstan 334. Two cable sets 332 are respectively connected to two sides of the three-dimensional frame structure assembly 310. One of the two cable sets 332 is connected to the cable spring balancer 333, while the other of the two cable sets 332 is connected to the cable capstan 334. While receiving the control signals from the control box 331, the cable capstan 334 is actuated to move the three-dimensional frame structure assembly 310.

The control adjustment set 330 adopts a time-controlling program to automatically adjust the angle within a large range according to a period of sunrise (or sunset) at the setup location. For example, in morning time, the cable capstan 334 rewinds the cable set 332 to tilt the system to the East, and the sun tracking module 120 of each solar energy light collecting device 100 intermittently fine-tunes the angle to track the Sun (as shown in FIG. 7a). Around noon time, the cable capstan 334 releases a part of the cable set 332 to keep the three-dimensional frame structure assembly 310 in horizontal state, such that each one of the plurality of solar energy light collecting devices 100 disposed above the three-dimensional frame structure assembly 310 can be at the same level. In the afternoon, the cable capstan 334 releases the cable set 332 and the cable spring balancer 333 rewinds the other cable set 332 on its side to tilt the entire system to the West. Therefore, the plurality of solar energy light collecting devices 100 do not shadow each other, and then the degradation of energy conversion efficiency is avoided.

Furthermore, the solar energy light collecting system 500 can also include a lifting platform 400, which can regulate the level of the balance adjustment module 300, and the base support set 320 is disposed above the lifting platform 400. The main purpose of the lifting platform 400 is to level the balance adjustment module 300, such that during the installation of the device, the maintenance, and disasters, the balance adjustment module 300 can be moved closer to the ground as much as possible. It offers safety and convenience of the operation.

In order to improve the efficiency of the energy conversion, depending on the demand, the three-dimensional frame structure assembly 310 is also configurable to include more solar energy light collecting devices 100 therein.

The content above is to further describe the present invention with these specific preferable embodiments. It is not intended to limit the present invention within the description. Several equivalent replacements or obvious variations with the same performance or use may be made by one skilled in the art without departing from the spirit of the present application, and should all be considered as falling within the protection scope of the present application.

What is claimed is:

1. A solar energy light collecting device, comprising:
a light reflection module comprising a plurality of reflection units, a reflection unit support beam, and a support wheel frame assembly, wherein the plurality of reflection units are disposed on the reflection unit support beam, and two ends of the reflection unit support beam are connected and fixed to the support wheel frame assembly, and the support wheel frame assembly comprises at least two support wheel frames and a rotation axis;
a sun tracking module comprising an angle adjustment set, a height adjustment set, and a supporter set, wherein two sides of the supporter set are respectively connected to the angle adjustment set and the height adjustment set, and the support wheel frame assembly is disposed on the supporter set, and the rotation axis acts as the rotational center of the light reflection module; and
a control module comprising a sense control unit and a driving motor, wherein the sense control unit is configured to sense the direction of sunlight and control the driving motor to drive the sun tracking module, such that the light reflection module faces the direction of the sunlight,
wherein the supporter set further comprises a South End supporter, a North End supporter, and two rotational support rods, and the height adjustment set is connected at the North End supporter, and the angle adjustment set is connected at the South End supporter and configured to drive one of the rotational support rods to adjust the position of the light reflection module.

2. The solar energy light collecting device of claim 1, wherein the support wheel frame assembly further comprises a counter weight balancing rod, which adjusts the rotational center of gravity of the light reflection module.

3. The solar energy light collecting device of claim 1, wherein the support wheel frame assembly further comprises a plurality of solar cell support tubes, and a plurality of solar cells are correspondingly disposed around the plurality of solar cell support tubes.

4. The solar energy light collecting device of claim 3, wherein the light reflection module further comprises a plurality of auxiliary concentration units that improves the light concentration power, and each of the plurality of auxiliary concentration units comprises a condenser lens, an auxiliary reflector, or a combination thereof, and the plurality of auxiliary concentration units are correspondingly disposed at an outer side of a hollow rod at the rotation axis and/or the plurality of solar cell support tubes.

5. The solar energy light collecting device of claim 1, wherein the reflection units are rectangular light reflective plates with concave surfaces or strip-shaped reflective plates with flat surfaces.

6. A solar energy light collecting system, comprising:
a plurality of solar energy light collecting devices of claim 1; and
a balance adjustment module, on which the plurality of solar energy light collecting devices are disposed, comprising a three-dimensional frame structure assembly, a base support set, and a control adjustment set, wherein the three-dimensional frame structure assembly is disposed on the base support set, and the control adjustment set is configured to adjust the position of the three-dimensional frame structure assembly.

7. The solar energy light collecting system of claim 6, wherein the three-dimensional frame structure assembly comprises a plurality of parallelogram frame structures and a plurality of transverse beams, and the plurality of transverse beams are pivotally connected to the plurality of parallelogram frame structures and controlled by the control adjustment set to move vertically.

8. The solar energy light collecting system of claim 6, wherein the control adjustment set comprises a control box, two cable sets, a cable spring balancer, and a cable capstan, and two cable sets are respectively connected to two sides of the three-dimensional frame structure assembly, one of the two cable sets is connected to the cable spring balancer, and the other of the two cable sets is connected to the cable capstan, which is actuated by a control signal from the control box.

9. The solar energy light collecting system of claim 6, further comprising a lifting platform configured to regulate the level of the balance adjustment module, wherein the base support set is disposed above the lifting platform.

* * * * *